United States Patent
Gupta et al.

(10) Patent No.: US 12,132,481 B2
(45) Date of Patent: Oct. 29, 2024

(54) METHODS AND APPARATUS TO BALANCE PROPAGATION DELAY AND BUS EMISSIONS IN TRANSCEIVERS

(71) Applicant: Texas Instruments Incorporated, Dallas, TX (US)

(72) Inventors: Lokesh Kumar Gupta, Bangalore (IN); Upasana Bhattacharya, Bengaluru (IN)

(73) Assignee: TEXAS INSTRUMENTS INCORPORATED, Dallas, TX (US)

(*) Notice: Subject to any disclaimer, the term of this patent is extended or adjusted under 35 U.S.C. 154(b) by 0 days.

(21) Appl. No.: 17/709,734

(22) Filed: Mar. 31, 2022

(65) Prior Publication Data
US 2023/0188138 A1 Jun. 15, 2023

(30) Foreign Application Priority Data
Nov. 18, 2021 (IN) .............................. 202141053004

(51) Int. Cl.
*H03K 19/0948* (2006.01)
*H03K 3/0233* (2006.01)
*H04L 12/40* (2006.01)

(52) U.S. Cl.
CPC ..... *H03K 19/0948* (2013.01); *H03K 3/02337* (2013.01); *H04L 12/4013* (2013.01); *H04L 2012/40215* (2013.01)

(58) Field of Classification Search
None
See application file for complete search history.

(56) References Cited

U.S. PATENT DOCUMENTS

2003/0234671 A1* 12/2003 Akiyoshi ................. H03K 5/06
327/172

OTHER PUBLICATIONS

Texas Instruments Incorporated, "TCAN1044V-Q1 Automotive Fault-Protected CAN FD Transceiver With 1.8-V I/O Support," Aug. 2019—Revised Oct. 2021, 43 pages.

* cited by examiner

Primary Examiner — Jany Richardson
(74) Attorney, Agent, or Firm — John R. Pessetto; Frank D. Cimino

(57) ABSTRACT

Methods, apparatus, systems, and articles of manufacture are disclosed to buffer an input voltage. An example apparatus includes first inverter circuitry to invert the input voltage and produce a first inverted voltage; second inverter circuitry coupled to the first inverter circuitry, the second inverter circuitry to invert the first inverted voltage and produce a second inverted voltage at a rate based on a first current controlled transistor; third inverter circuitry coupled to the second inverter circuitry, the third inverter circuitry to invert the second inverted voltage and produce a third inverted voltage at a rate based on a second current controlled transistor; and fourth inverter circuitry coupled to the third inverter circuitry, the fourth inverter circuitry to invert the third inverted voltage and produce an output voltage, wherein the output voltage matches the input voltage.

18 Claims, 5 Drawing Sheets

METHODS AND APPARATUS TO BALANCE PROPAGATION DELAY AND BUS EMISSIONS IN TRANSCEIVERS

RELATED APPLICATION

This application claims the benefit of and priority to Indian Patent Application Number 202141053004, which was filed on Nov. 18, 2021, and is hereby incorporated by reference in its entirety.

FIELD OF THE DISCLOSURE

This disclosure relates generally to Controller Area Network (CAN) devices and, more particularly, to methods and apparatus to balance propagation delay and bus emissions in transceivers.

BACKGROUND

CAN refers to a vehicle standard that connects various Electronic Control Units (ECUs) to one another. Through CAN, vehicle systems controlled by an ECU exchange information over a wiring system known as a CAN bus. This contrasts with older vehicles that do not use a CAN bus, which rely on complex wiring between specific ECUs for vehicle systems to share information. High-speed CAN networks are implemented with two wires and allow communications at transfer rates up to 1 Mbit/s. Flexible Data-Rate CAN networks may allow for higher data rates. Low-speed/fault-tolerant CAN networks are also implemented with two wires, can communicate with devices at rates up to 125 kbit/s, and offer transceivers with fault-tolerant capabilities. Single-wire CAN interfaces can communicate with devices at rates up to 33.3 kbit/s (88.3 kbit/s in high-speed mode). Typical single-wire devices applications include comfort devices such as seat and mirror adjusters.

Over time, updates to the CAN bus standard allow for increased functionality, bandwidth, and robustness.

SUMMARY

An example apparatus includes first inverter circuitry to invert the input voltage and produce a first inverted voltage; second inverter circuitry to invert the first inverted voltage and produce a second inverted voltage at a rate based on a first current controlled transistor; third inverter circuitry to invert the second inverted voltage and produce a third inverted voltage at a rate based on a second current controlled transistor; and fourth inverter circuitry to invert the third inverted voltage and produce an output voltage, wherein the output voltage matches the input voltage.

BRIEF DESCRIPTION OF THE DRAWINGS

In general, the same reference numbers or other reference designators are used throughout the drawing(s) and accompanying written description to refer to the same or similar (functionally and/or structurally) features. The figures are not to scale.

DETAILED DESCRIPTION

Figure 1:
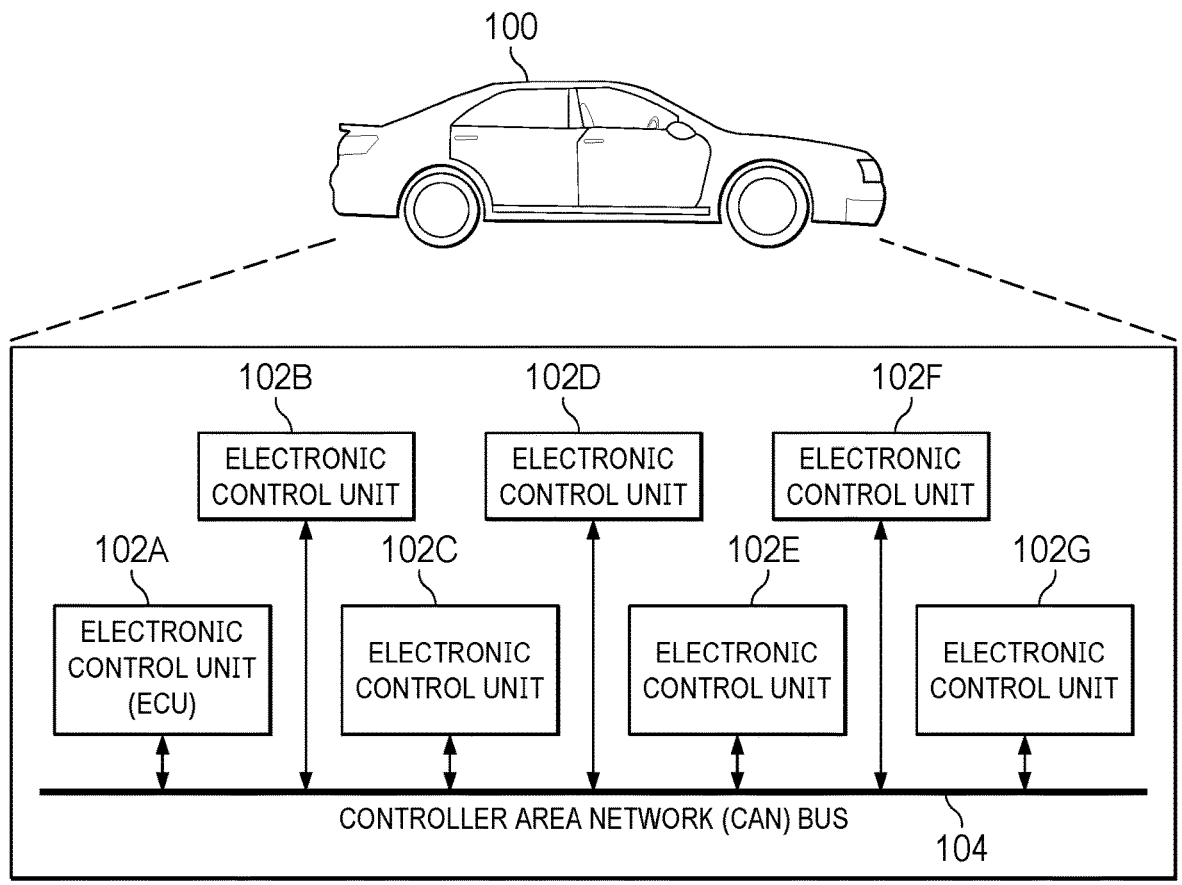
FIG. 1 is a block diagram of an example vehicle communication system.

One example of an updated CAN standard is referred to as Signal Improvement Capability (CAN-SIC). The CAN-SIC standard allows for more complex network topologies at higher communication bit rates than previous CAN standards.

To send information over and receive information from a CAN bus, an ECU includes transceiver circuitry. Transceiver circuitry receives an analog input signal from the CAN bus and converts the analog signal into a digital signal. The transceiver circuitry uses a high supply voltage to represent a '1' bit (e.g., a logic "high") in the digital input signal, and a low supply voltage to represent a '0' bit (e.g., a logic "low") in the digital input signal. In transceiver circuitry using the CAN-SIC standard, the high supply voltage may be any value between +1.7 Volts (V) and +5.5 V. Similarly, the low supply voltage in transceiver circuitry using the CAN-SIC standard may be a value at or near 0 V. The exact value of the low supply voltage may be dependent on an amount of noise experienced on the CAN bus. In other examples, the high supply voltage may have different upper bound and lower bound voltages.

The value of the high supply voltage affects bus emissions corresponding to the transceiver circuitry. For example, transceiver circuitry contains logical output buffers to store a number of digital bits before transferring them to processor circuitry. When a memory in the digital buffer changes to store a different bit (e.g., a transition from a '1' bit to a '0' bit or vice versa), the transition causes electromagnetic emissions on the CAN bus, which in turns disrupts the signal integrity of information on the bus. The amount of electromagnetic emissions caused by bit transitions in the logical output buffers is directly proportional to how quickly the bit transition occurs, which in turn is directly proportional to the high supply voltage. As a result, a high supply voltage near +5.5 V will result in faster bit transitions and more emissions on the CAN bus than when the high supply voltage is near +1.7 V.

The value of the high supply voltage also effects a propagation delay corresponding to the transceiver circuitry. Propagation delay refers to the amount of time it takes for an example transceiver circuitry to receive a number of digital bits from processor circuitry, convert the digital bits into an analog signal, send the analog signal over the CAN bus, receive (e.g., by a receiver or another transceiver) the same analog signal, convert the analog signal back into the digital bits, and provide the digital bits to processor circuitry. An example transceiver circuit using the CAN-SIC standard is required to have a propagation delay of 190 nanoseconds (ns). Because the high supply voltage is directly proportional to the rate at which bit transitions in the logical output buffer, a high supply voltage near +1.7 V will result in a larger propagation delay than a high supply voltage near +5.5 V. As a result, transceiver circuitry with a high supply voltage near +1.7 V may be unable to satisfy the propagation delay requirements of the CAN-SIC standard.

A logic output buffer of some examples herein can mitigate emissions on the CAN bus and satisfy the propagation delay requirements of the CAN-SIC standard, regardless of whether high supply voltage is +1.7 V, +5.5 V, or some voltage in between. Example logic output buffer circuitry includes inverter circuitry with transistors that have sufficient power ratings to increase the rate of bit transitions and satisfy the propagation delay requirement when the high supply voltage is near +1.7 V. Example logic output buffer circuitry also includes example current controlled transistors to conditionally increase a load experienced by the inverter circuitry when the high supply voltage is above a threshold voltage (i.e., when the high supply voltage is near +5.5 V), thereby decreasing the rate of bit transitions and mitigating emissions.

FIG. 1 is a block diagram of an example vehicle communication system. FIG. 1 includes a vehicle 100, ECUs 102A, 102B, 102C, 102D, 102E, 102F and 102G (collectively and individually referred to as ECU 102) and a CAN bus 104.

The vehicle 100 of FIG. 1 is any vehicle that includes a CAN bus 104. The vehicle 100 includes multiple systems which provide various functionalities. Example vehicle systems include but are not limited to the suspension, brakes, air conditioning, instrument panels, seat modules, transmission, batteries, engine, etc.

Each of the ECUs 102 of FIG. 1 control one of the vehicle systems. An ECU 102A may control a vehicle system by receiving information from another ECU 102B over the CAN bus 104 and causing an action to occur in the vehicle system based on the received information. For example, an ECU 102A that controls an engine may transmit rotational speed and/or torque information over the CAN bus 104. The information may be received over the CAN bus 104 by an ECU 102B that controls a transmission. Based on the received rotational speed and/or torque information, the ECU 102B may send a signal to the transmission to shift gears. In some examples, the vehicle may contain a different number of ECUs than the example system of FIG. 1.

The CAN bus 104 of FIG. 1 is a wiring system that connects to all the ECUs 102A-102G. The ECUs 102A-102G communicate to one another over the CAN bus 104 using the CAN standard. The use of the CAN bus 104 provides a standardized method for ECUs 102A-102G to share information and simplify the wiring required to enable said information sharing. As a result, the CAN bus 104 is used in a wide variety of vehicles and vehicle systems.

Figure 2:
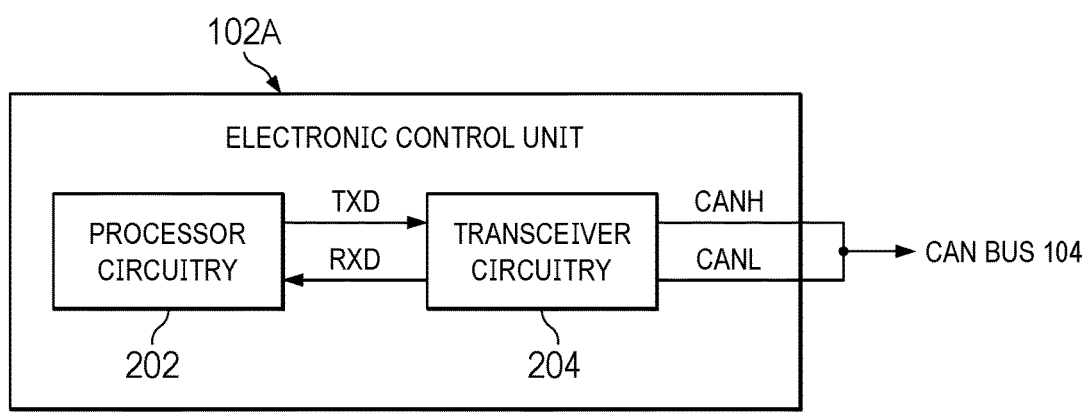
FIG. 2 is a block diagram of an example Electronic Control Unit (ECU) described in FIG. 1.

FIG. 2 is a block diagram of an ECU 102 described in FIG. 1. The ECU 102 of FIG. 2 may be instantiated (e.g., creating an instance of, bring into being for any length of time, materialize, implement, etc.) by a processor platform 500 as described in FIG. 5. The ECU 102 includes processor circuitry 202 and transceiver circuitry 204. ECU 102 may include digital circuitry (e.g., logic circuitry), analog circuitry (e.g., amplifiers, filters, transistors, etc.), converters (e.g., voltage converter, voltage regulators, analog-to-digital converters and/or digital-to-analog converters), sensors, memory, processor, state machine, microcontroller, microcomputer and/or software.

The processor circuitry 202 of FIG. 2 executes instructions to control the vehicle system corresponding to the ECU 102. The instructions could be for any purpose, including but not limited to sensing, signal processing, and actuation applications related to the vehicle system. In some examples, the instructions cause the processor circuitry 202 to transmit or receive data over the CAN bus 104.

The transceiver circuitry 204 of FIG. 2 enables the transfer of data between the processor circuitry 202 and other ECUs 102 coupled to the CAN bus 104. When the processor circuitry 202 has data to send on the CAN bus 104, it provides the data (e.g., digital bits) to the transceiver circuitry 204 via a transmit connection (TXD) (e.g., a pin, terminal and/or conductor). The transceiver circuitry 204 converts the digital bits to an analog signal and transmits the signal on the CAN bus 104 using CAN-High (CANH) and CAN-Low (CANL) pins. When the processor circuitry 202 executes instructions to receive data from the CAN bus 104, the transceiver circuitry 204 receives an analog signal over the CANH and CANL pins and converts the analog signal into digital bits. The transceiver circuitry 204 then stores the digital bits in a buffer and provides the digital bits to the processor circuitry 202 via a receive connection (RXD) (e.g., a pin, terminal and/or conductor). The transceiver circuitry 204 may include additional connections not illustrated in FIG. 2. The transceiver circuitry 204 is explored further in FIG. 3.

Figure 3:
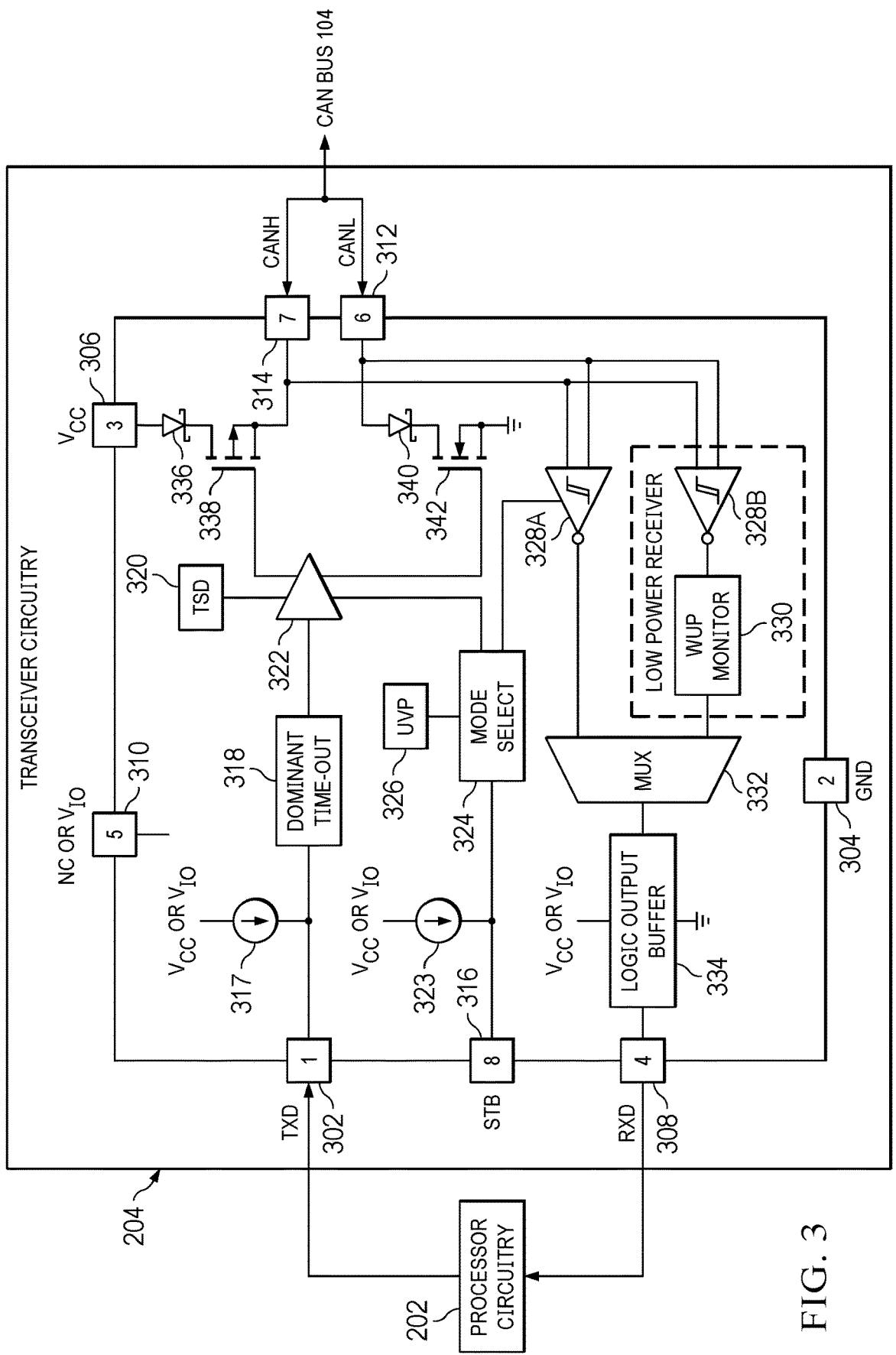
FIG. 3 is a block diagram of example transceiver circuitry in FIG. 2.

FIG. 3 is a block diagram of the example transceiver circuitry 204 of FIG. 2, where, for example, transceiver 204 is implemented as a single integrated circuit (e.g., on a single semiconductor substrate or semiconductor die, within a single semiconductor package and/or part of a multi-chip module). The example transceiver circuitry 204 includes a TXD pin 302, Ground (GND) pin 304, Voltage Common Collector (VCC) pin 306, RXD pin 308, Voltage Input Output (VIO) pin 310, CANL pin 312, CANH pin 314, Standby input for mode (STB) pin 316, current supplies 317, 323, dominant time out circuitry 318, Thermal Shut Down (TSD) circuitry 320, driver circuitry 322, mode select circuitry 324, Under Voltage Protection (UVP) circuitry 326, receiver circuitry 328A and 328B, Wake Up Pattern (WUP) monitor circuitry 330, multiplexer (MUX) circuitry 332, logic output buffer circuitry 334, Schottky diodes 336, 340, and transistors 338, 342. The example transceiver circuitry 204 may be implemented by devices including but not limited to the Texas Instruments® TCAN1044V-Q1 Automotive Fault-Protected CAN FD Transceiver, whose data sheet is hereby incorporated by reference in its entirety.

The TXD pin 302 of FIG. 3 receives data from the processor circuitry 202 and provides the digital bits to the driver circuitry 322. To prevent a floating voltage and/or self-biasing, the example current supply 317 may pull the voltage provided by the TXD pin 302 up to the high supply voltage. In the illustrative example of FIG. 3, the transceiver circuitry 204 additionally implements dominant time out circuitry 318, which, as a safety feature, disables the driver circuitry 322 if the TXD pin provides dominant digital bits for an amount of time that exceeds a threshold. Dominant refers to a mode of transmitting data as defined by the CAN standard. In other examples, the transceiver circuitry 204 may not include dominant time out circuitry 318.

The driver circuitry 322 of FIG. 3 receives the digital bits and outputs an analog signal to represent the data. In the analog signal, the driver circuitry 322 represents a '1' bit as a high supply voltage and a '0' bit as a low supply voltage. The high supply voltage may be between +1.7 V and +5.5 V. The high supply voltage may be provided by the VCC pin 306 or the VIO pin 310. The low supply voltage may be at or near 0 V, which is provided by the GND pin 304. Driver circuitry 322 may include digital circuitry (e.g., logic circuitry), analog circuitry (e.g., amplifiers, filters, transistors, etc.) and/or converters (e.g., analog-to-digital converters and/or digital-to-analog converters).

In the illustrative example of FIG. 3, the transceiver circuitry 204 additionally implements TSD circuitry 320 that, as a safety feature, disables the driver circuitry 322 if a temperature corresponding to the driver circuitry 322 exceeds a threshold value. In other examples, the transceiver circuitry 204 may not include TSD circuitry 320.

The driver circuitry 322 produces an analog signal based on information received by the mode select circuitry 324 of FIG. 3. This information may include but is not limited to whether the driver circuitry 322 produces an analog signal in (a) the dominant mode or (b) a recessive mode, which is an alternative mode to dominant as defined by the CAN standard. Before providing the information to the driver circuitry 322, the mode select circuitry 324 may receive the information from the processor circuitry 202 via the STB pin 316. To prevent a floating voltage and/or self-biasing, the example current supply 323 may pull the voltage provided by the STB pin 316 up to the high supply voltage. In the illustrative example of FIG. 3, the transceiver circuitry 204 additionally implements UVP circuitry 326 that, as a safety feature, instructs the mode select circuitry 324 to enter a protected mode in response to a determination that one or more of supply voltage from the VCC pin 306 or VIO pin 310 falls below a threshold voltage. In other examples, the transceiver circuitry 204 may not include UVP circuitry 326.

The analog signal produced by the driver circuitry 322 is transmitted to the CAN bus 104 via the CANH pin 314 and CANL pin 312 of FIG. 3. The CANH pin 314 and CANL pin 312 connect to CANH and CANL lines within the CAN bus 104, where the voltage between the CANH and CANL lines represent the logical bug state (i.e., dominant, recessive, etc.). The signal on the CANH and CANL lines may be a differential signal.

The example Schottky diode 336 of FIG. 3 protects the Vcc pin 306 from high voltages on the CAN bus. For example, if the CANH pin 314 experiences a voltage that is larger than the high supply voltage, the example Schottky diode 336 may become reversed biased and prevent the large voltage and potentially large current experienced on the CANH pin 314 from reaching the Vcc pin 306. Similarly, if a high negative voltage is transmitted on the CAN bus and experienced on the CANH pin 314, the transistor 338 may become reversed biased and prevent a large current from reaching the Vcc pin 306.

The example Schottky diode 340 protects the GND pin 304 from high negative voltages on the CAN bus. For example, if the CANL pin 312 experiences a voltage that is less than 0 V, the example Schottky diode 340 may become reverse biased and prevent the high negative voltage and potentially large current experienced on the CANL pin 312 from reaching the GND pin 304. Similarly, if a high voltage is experienced on the CANL pin 312, the transistor 342 may become reversed biased and prevent a large current from flowing to the GND pin 304.

The receiver circuitry 328A-328B of FIG. 3 receive an analog signal as a voltage difference between the CANH pin 314 and CANL pin 312. The receiver circuitry 328A-328B then convert the received analog signal into digital bits. In some examples, the conversion of the analog signal to digital bits may be referred to as resolving the signal. In addition, receiver circuitry 328A and/or 328B may convert the data from a differential signal to a single ended signal (e.g., convert from a differential analog signal to a digital signal). Receiver circuitry 328A and/or 328B may include digital circuitry (e.g., logic circuitry), analog circuitry (e.g., amplifiers, filters, transistors, etc.) and/or converters (e.g., analog-to-digital converters and/or digital-to-analog converters).

The receiver circuitry 328A and 328B may amplify a voltage difference to resolve the signal. For example, when the example transceiver circuitry 204 is not in standby mode and the difference between the voltage difference between the CANH pin 314 and CANL pin 312 is greater than or equal to +0.9 V, the receiver circuitry 328A may set the RXD pin 308 to 0 V to represent a digital '0' bit. Similarly, when not in standby mode, the receiver circuitry 328A may set the RXD pin 308 to the high supply voltage to represent a digital '1' bit when the difference between the voltage difference between the CANH pin 314 and CANL pin 312 is less than or equal to +0.5 V. In such examples, the receiver circuitry 328A may consider a voltage difference between the CANH pin 314 and CANL pin 312 that is greater than +0.5 V and less than +0.9 V as undefined. In other examples when the example transceiver circuitry 204 is in standby mode, the example receiver circuitry 328B may set the RXD pin 308 to a digital '1' bit until a remote wake event occurs.

In the illustrative example of FIG. 3, the transceiver circuitry 204 implements a low power mode to save energy in situations where the CAN bus 104 is inactive. In such examples, the transceiver circuitry may receive a specific pattern of bits referred to as a WUP. As a result, the WUP monitor circuitry 330 connects to the receiver circuitry 328B and sends a message to the processor circuitry 202 when the WUP is identified.

The MUX circuitry 332 of FIG. 3 selects either (a) the digital bits from the receiver circuitry 328A or (b) the message from the WUP monitor circuitry 330 and stores the information in the example logical output buffer circuitry 334. The MUX circuitry 332 may determine which information to store in the example logical output buffer circuitry 334 based on whether the low power mode or normal mode. In other examples that do not support low power mode, the transceiver circuitry 204 may not include the receiver circuitry 328B, WUP monitor circuitry 330, or MUX circuitry 332.

The example logic output buffer circuitry 334 of FIG. 3 transfers data from the MUX circuitry 332 to the RXD pin 308, where it is received by the processor circuitry 202. The logic output buffer circuitry 334 represents a '1' bit as the high supply voltage that comes from the same pin (e.g., either the VCC pin 306 or VIO pin 310) as the high supply voltage used by the driver circuitry 322. Similarly, the example logic output buffer circuitry 334 represents a '0' bit using the voltage provided by the GND pin 304. To meet CAN-SIC standards, approximately 34 ns of the 190 ns propagation delay may be attributable to the example logic output buffer circuitry 334. The example logic output buffer circuitry 334 is explained further in FIG. 4.

When the bits provided by the MUX circuitry 332 to the example logic output buffer circuitry 334 change, the resulting bit transitions in the logic output buffer circuitry 334 causes noise within the high supply voltage signal for a period of time. In some examples, the noise may be referred to as a voltage bounce. Because the high supply voltage and low supply voltage used by the logic output buffer circuitry come from the same pins that are also used by the driver circuitry 322 (e.g., the VCC pin 306 and the GND pin 304), this voltage bounce is also transferred to the driver circuitry 322 and sent over the CAN bus 104 as a form of electromagnetic emissions. The example logic output buffer circuitry 334 mitigates the amount of electromagnetic emissions while also meeting the propagation delay requirement for CAN-SIC standards. In some examples, the example logic output buffer circuitry 334 may additionally or alternatively satisfy an electromagnetic emissions threshold corresponding to the CAN bus 104.

Figure 4:
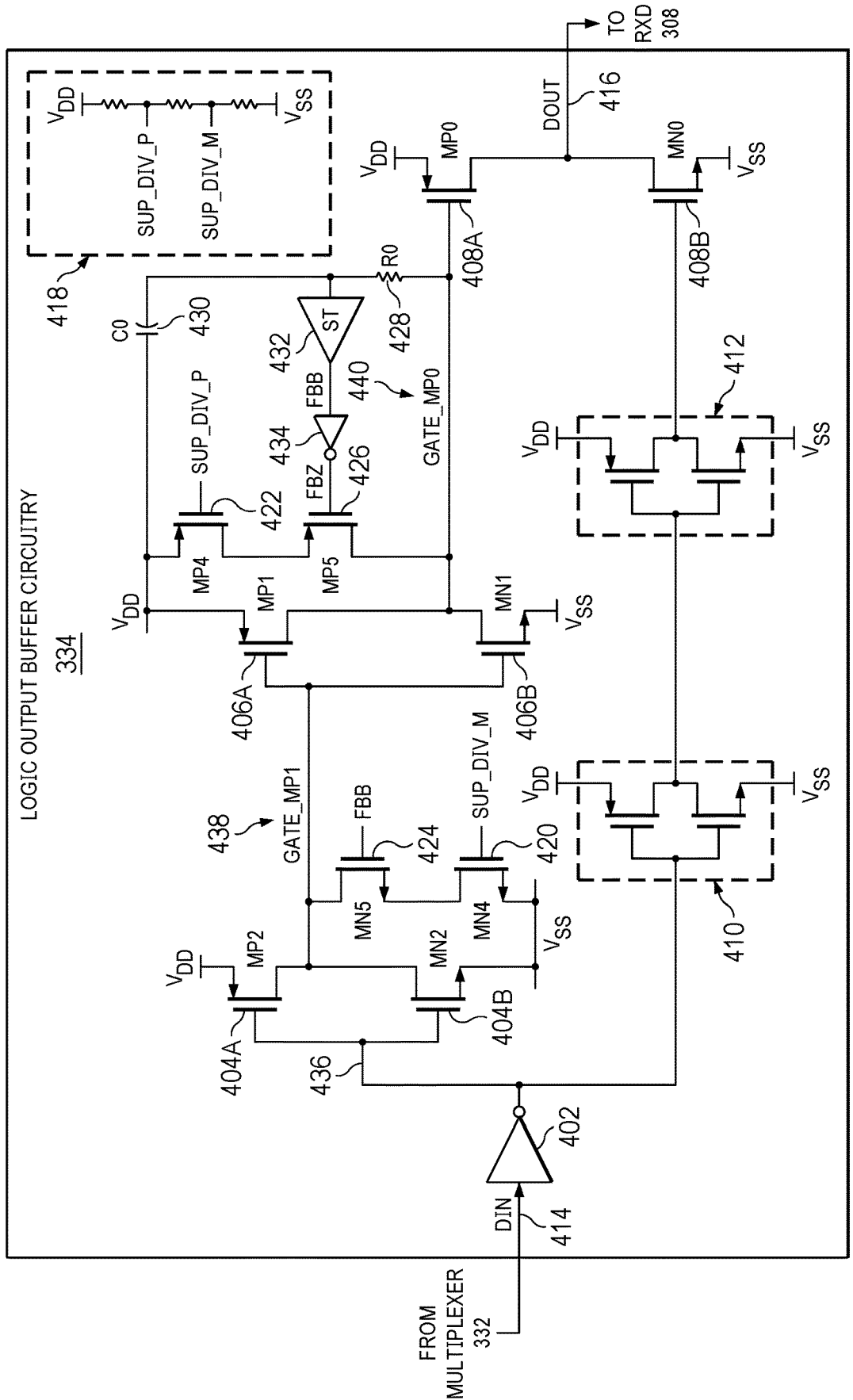
FIG. 4 is a circuit diagram of the example logic output buffer of FIG. 3 as implemented in accordance with the teachings of this disclosure.

FIG. 4 is a circuit diagram of the example logic output buffer circuitry 334 of FIG. 3 as implemented in accordance with some examples of this disclosure. FIG. 4 includes first Complementary Metal Oxide Semiconductor (CMOS) inverter circuitry 402, second CMOS inverter circuitry 404 (which includes p-type Metal Oxide Semiconductor (PMOS) transistor MP2 404A and n-type Metal Oxide Semiconductor (NMOS) transistor MN2 404B), third CMOS inverter circuitry 406 (which includes PMOS transistor MP1 406A and NMOS transistor MN1 406B), fourth CMOS inverter circuitry 408 (which includes PMOS transistor MP0 408A and NMOS transistor MN0 408B), fifth CMOS inverter circuitry 410, sixth CMOS inverter circuitry 412, a Digital Input (DIN) voltage 414, and a Digital Output (DOUT) voltage 416. FIG. 4 also includes additional circuitry such as supply divider circuitry 418, current controlled transistors MN4 420 and MP4 422, switch circuitry MN5 424 and MP5 426, a resistive capacitance (RC) filter (including R0 428 and C0 430), Schmitt trigger circuitry 432, and seventh CMOS inverter circuitry 434. Furthermore, the first CMOS inverter circuitry 402 and second CMOS inverter circuitry 404 are connected by a first inverted node 436, the second CMOS inverter circuitry 404 and third CMOS inverter circuitry 406 are connected by a second inverted node (GATE_MP1 438), and the third CMOS inverter circuitry 406 and the gate of transistor MP0 408A are connected by a third inverted node (GATE_MP0 440).

The example logic output buffer circuitry 334 is implemented by a sequence of CMOS inverter circuits and is configured so that the DOUT voltage 416 matches the DIN voltage 414. Hence, a change in the DIN voltage 414 corresponds to the same change in the DOUT voltage 416. In doing so, the example logic output buffer circuitry 334 does not lose or distort the data encoded in the DIN voltage 414. In some examples, the DIN voltage 414 may be referred to as an input data signal.

A CMOS inverter circuit is composed of a PMOS transistor and an NMOS transistor connected in parallel. Both drain terminals of the PMOS and NMOS transistor connect to form an output signal, while the source terminal of the PMOS transistor is connected to the VCC pin 306 (shown as Vdd in FIG. 4) and the source terminal of the NMOS transistor is connected to the GND pin 304 (shown as Vss in FIG. 4). As used herein, the terms "high supply voltage" and "Vdd" may be used interchangeably to refer to the voltage provided by the VCC pin 306, which may be anywhere between +1.7 V and +5.5 V as described by the CAN-SIC standard. Similarly, the terms "low supply voltage" and "Vss" may be used interchangeably to refer to the voltage provided by the GND pin 304. In some examples, the gate terminals of both transistors are connected to receive the same input signal.

The gate of the PMOS transistor MP0 408A receives a first branch signal, while the gate of the NMOS transistor MN0 408B receives a separate second branch signal. By separating the input to the fourth CMOS circuitry 408, the logic output buffer circuitry 334 prevents a short circuit occurring between the VCC pin 306, RXD pin 308, and GND pin 304 when a bit transition occurs. In some examples, the use of two separate inputs instead of a single input from a common node may be referred to as a "break before make" architecture. After the first CMOS inverter circuitry 402 receives the DIN voltage 414 from the MUX circuitry 332 and produces the first inverted voltage, the logic output buffer circuitry 334 splits the first inverted voltage into a first branch and a second branch at the first inverted node 436. In some examples, the first inverted voltage may be referred to as a first inverted data signal. In the first branch, data travels through the second CMOS inverter circuitry 404, GATE_MP1 438, the third CMOS inverter circuitry 406, GATE_MP0 440, and MP0 408A in the fourth CMOS inverter circuitry 408. In the second branch, the same data travels through the fifth CMOS inverter circuitry 410 to the sixth CMOS inverter circuitry 412 to the gate terminal of MN0 408B in the fourth CMOS inverter circuitry 408.

To ensure that the transceiver circuitry 204 meets the propagation delay requirement for CAN-SIC devices, the PMOS and NMOS transistors of the example logic output buffer circuitry 334 may be implemented with sufficient drive strength to support the propagation delay requirement even when bit transitions are slow (e.g., when the high supply voltage is at or near +1.7 V). As used herein, drive strength refers to a relationship between the output voltage and output current of a CMOS transistor. The size of transistors in the example logic output buffer circuitry 334 may be larger than previous implementations of logic output buffer circuitry 334 that did not use the CAN-SIC standard. These larger transistors may exhibit a higher drive strength by supplying a desired output current faster than previous implementations. In some examples, the example logic output buffer circuitry 334 experienced 25 ns of the 190 ns propagation delay requirement, which satisfies the 34 ns target delay for logic output buffers in CAN-SIC devices. In such previous implementations, replacing the existing transistors with higher drive strength equivalents may result in the previous implementation meeting the propagation delay for CAN-SIC. However, the replaced transistors would also cause increased electromagnetic emissions when the high supply voltage is near or at +5.5 V.

To meet the propagation delay for CAN-SIC and minimize electromagnetic emissions on the CAN bus 104, the example logic output buffer circuitry 334 of FIG. 4 includes additional circuitry to conditionally slow down the rate of bit transitions when the high supply voltage is at or near +5.5 V. This additional circuitry includes the supply divider circuitry 418, current controlled transistors MN4 420 and MP4 422, switch circuitry MN5 424 and MP5 426, a resistive capacitance (RC) filter R0 428 and C0 430, Schmitt trigger circuitry 432, and seventh CMOS inverter circuitry 434.

The supply divider circuitry 418 of FIG. 4 is a voltage divider circuit. The supply divider circuitry 418 generates a first divider voltage (SUP_DIV_M) and a second divider voltage (SUP_DIV_P) that are both between the high supply voltage and the low supply voltage. The supply divider circuitry 418 includes resistors that determine the value of the first divider and second divider voltages. Various implementations of the example logic output buffer circuitry 334 may implement different resistor values in the supply divider circuitry 418 to achieve pre-determined values for the first and second divider voltages.

The first divider voltage is provided to the gate terminal of MN4 420. As a result, MN4 420 may be considered an implementation of a current controlled transistor, as current can only pass from the source terminal to the drain terminal when the first divider voltage meets a MN4 threshold voltage. The first divider voltage may meet the MN4 threshold voltage if the first divider voltage is greater or equal to the MN4 threshold voltage.

The MN4 threshold voltage may be a pre-determined value based on the power rating of MN4 420. In some examples, the MN4 threshold voltage may be approximately +0.7 V. In examples where the high supply voltage is at or near +5.5 V, the first divider voltage may be greater than the MN4 threshold voltage. Conversely, in examples where the high supply voltage is at or near +1.7 V, the first divider voltage may be less than the MN4 threshold voltage. Furthermore, in examples where the first divider voltage is greater than the MN4 threshold voltage, the amount of current that passes through MN4 420 is proportional to the magnitude of the voltage difference between the first divider voltage and the MN4 threshold voltage. This affects the rate at which the second inverted node (i.e., GATE_MP1 438) changes voltage, as the rate is dependent on the total amount of current that is provided to MP1 406A. In some examples, the voltage at GATE_MP1 438 may be referred to as a second inverted data signal.

For example, suppose that the high supply voltage is at or near +5.5 V, and that DIN voltage 414 includes a bit transition from a '0' bit to a '1' bit. As a result, the voltage at the first inverted node 436 transitions from a '1' bit to a '0' bit and GATE_MP1 438 transitions from a '0' bit to a '1' bit during the bit transition. In previous implementations of logic output buffer circuitry, current would travel from Vdd, through MP2 404A, and only a first amount of current would travel through MN2 404B as the remaining current would travel to the third CMOS inverter circuitry 406 and affect the speed at which GATE_MP1 438 transitions from 0 V to the high supply voltage. When the same example is implemented in the example logic output buffer circuitry 334 of FIG. 4, however, current must travel through (a) MN2 404B and (b) MN4 420 when the first divider voltage is greater than the MN4 threshold voltage. Therefore, when the high supply voltage is at or near +5.5 V, the total amount of current traveling into the third CMOS inverter circuitry 406 is smaller due to MN4 420 being enabled, and the rate at which GATE_MP1 438 transitions from 0 V to +5.5 V is slower. When the high supply voltage is at or near +1.7 V, however, the first divider voltage is less than the MN4 threshold voltage throughout the course of the bit transition, so current does not travel through MN4 420. As a result, the addition of MN4 420 in the example logic output buffer circuitry 334 of FIG. 4 only affects bit transition rates when the high supply voltage is at or near +5.5 V.

The second divider voltage is provided to the gate terminal of MP4 422. As a result, MP4 422 may also be considered an implementation of a current controlled transistor, as current can only pass from the source terminal to the drain terminal when the difference between the high supply voltage and the second divider voltage meets a MP4 threshold voltage (e.g., $V_{dd}-SUP_{DIV_P} \geq V_{Th\ MP4}$). The difference between the high supply voltage and the second divider voltage may meet the MP4 threshold voltage if the difference is greater or equal to the MP4 threshold voltage.

The MP4 threshold voltage may be a pre-determined value based on the power rating of MP4 422. In some examples, the MN4 threshold voltage may be approximately +0.7 V. In examples where the high supply voltage is at or near +5.5 V, both $V_{dd}$ and the second divider voltage may be sufficiently high such that $V_{dd}-SUP\_DIV\_P \geq V_{Th\ MP4}$. Conversely, in examples where the high supply voltage is at or near +1.7 V, both $V_{dd}$ and the second divider voltage may be sufficiently low such that $V_{dd}-SUP_{DIV_P} < V_{Th\ MP4}$. Similar to how MN4 420 affects the rate at which the voltage at GATE_MP1 438 changes, MP4 422 affects the rate at which the GATE_MP0 440 changes based on (a) the amount of current that travels through MP4 422 when $V_{dd}-SUP\_DIV\_P \geq V_{Th\ MP4}$ and (b) the total amount of current that travels to MP0 408A. In some examples, the voltage at GATE_MP0 440 may be referred to as a third inverted data signal.

In the foregoing example where the high supply voltage is at or near +5.5 V and DIN voltage 414 includes a bit transition from a '0' bit to a '1' bit, the rate at which GATE_MP1 438 transitions from a '0' bit to '1' bit was slower than previous implementations of logic output buffer circuitry due to MN4 420. In the same example, the voltage at GATE_MP0 440 changes from a '1' bit to a '0' bit during the bit transition. Without the presence of additional circuitry to conditionally slow bit transitions, the transition of GATE_MP1 438 from '0' bit to '1' bit would cause current to travel from $V_{dd}$ through MP1 406A and only through MN1 406B before reaching the GND pin 304 and causing the voltage at GATE_MP0 440 to fall to a '0' bit. In the example logic output buffer circuitry 334 of FIG. 4 however, the rate at which current travels from $V_{dd}$ to MN1 406B is slower due to MN4 420 slowing the rate at which GATE_MP1 438 changes. Furthermore, additional current travels from $V_{dd}$ to MP4 422 when $V_{dd}-SUP\_DIV\_P \geq V_{Th\ MP4}$. As a result, when the high supply voltage is at or near +5.5 V, the total amount of current that travels to MP0 408A is smaller and GATE_MP0 440 transitions to '0' bit at a slower rate due to MP4 422. When the high supply voltage is at or near +1.7 V, however, the difference between $V_{dd}$ and the second divider voltage is greater than the MP4 threshold voltage and MP4 422 is disabled. As a result, the addition of MP4 422 conditionally reduces the bit transition rate when the high supply voltage is at or near +5.5 V.

The addition of current controlled transistors MN4 420 and MP4 422 helps reduce the total amount of current provided to MP0 408A and slows bit transitions when the high supply voltage is at or near +5.5 V. While this current draw is advantageous during bit transitions to reduce bounce on the VCC pin 306 and mitigate electromagnetic emissions on the CAN bus 104, current would not be fully utilized if MN4 420 and MP4 422 stayed enabled when a bit transition is not occurring. Furthermore, if the current controlled transistors were permanently enabled, then the voltages for GATE_MP0 440 and GATE_MP1 438 would be unable to fully transition to the required voltage (e.g., the voltage required to represent a '0' bit or a '1' bit) during a bit transition because some of the current required to make the full transition would be travelling through the current controlled transistor.

To prevent unused current when a bit transition is not occurring and to allow GATE_MP1 438 and GATE_MP0 440 to fully transition to the required voltage during a bit transition, the example logic output buffer circuitry 334 implements MN5 424 and MP5 426 as switch circuitry to conditionally disable MN4 420 and MP4 422 once the voltage at the relevant gate nears its desired voltage. In the foregoing example, where the high supply voltage is at or near +5.5 V, the DIN voltage 414 transitions from a '0' bit to a '1' bit, the voltage at GATE_MP1 438 transitions from a '0' bit to a '1' bit, the voltage at GATE_MP0 440 transitions from a '1' bit to a '0' bit, and both MN5 424 and MP5 426 begin the bit transition enabled. This allows MN4 420 and MP4 422 to function as current controlled transistors and slow the bit transition rate as described previously. As the bit transition concludes, the voltage at GATE_MP0 440 meets a trigger threshold voltage. The voltage at GATE_MP0 440 may meet the trigger voltage if the voltage at GATE_MP0 is less than or equal to the trigger threshold voltage.

In some examples, the trigger threshold voltage is a pre-determined value that is near 0 V but not equal to 0 V. Once the GATE_MP0 440 voltage is below the trigger threshold voltage, it causes the Schmitt trigger circuitry 432 to produce a digital '0'. This low supply voltage is provided to the gate terminal of MN5 424, which disables the transistor and prevents current from travelling from GATE_MP1

438 through MN4 420 and to the GND pin 304. This allows the voltage at GATE_MP1 438, which is near but not at the high supply voltage when MN5 424 is disabled, to fully transition to the high supply voltage without any current leakage.

Similarly, in the foregoing example, the high supply voltage provided by the Schmitt trigger circuitry 432 is inverted by the seventh CMOS inverter circuitry 434, which results in the high supply voltage being provided to the gate terminal of MP5 426. This high supply voltage disables MP5 426 and prevents additional current from travelling through MP4 422. As a result, the voltage at GATE_MP0 440 is allowed to fully transition to the low supply voltage without current leakage. Finally, R0 428 and C0 430 act as a filter to prevent any noise in the voltage at GATE_MP0 440 from erroneously activating the Schmitt trigger circuitry 432 before the voltage at GATE_MP0 440 falls below the trigger threshold voltage.

The example logic output buffer circuitry 334 of FIG. 4 is implemented with additional circuitry in the form of supply divider circuitry 418, current controlled transistors MN4 420 and MP4 422, switch circuitry MN5 424 and MP5 426, an RC filter R0 428 and C0 430, Schmitt trigger circuitry 432, and seventh CMOS inverter circuitry 434. This additional circuitry is configured to slow the rate at which the voltage at GATE_MP0 440 changes during a bit transition, which reduces the amount of voltage bounce experienced by the VCC pin 306 and the amount of emissions on the CAN bus 104. In other examples, the fifth CMOS inverter circuitry 410 and sixth CMOS inverter circuitry 412 may be additionally or alternatively configured with additional circuitry to slow the rate at which MN0 408B changes voltage and reduce the amount of voltage bounce experienced on the GND pin 304.

The example logic output buffer circuitry 334 of FIG. 4 includes additional circuitry to conditionally slow the bit transition rate when the high supply voltage is at or near +5.5 V. As a result, transceiver circuitry 204 that implements the example logic output buffer circuitry 334 of FIG. 4 can mitigate electromagnetic emissions on the CAN bus 104 when the high supply voltage is at or near +5.5 V while also meeting the propagation delay requirement for CAN-SIC devices when the high supply voltage is at or near +1.7 V.

Figure 5:
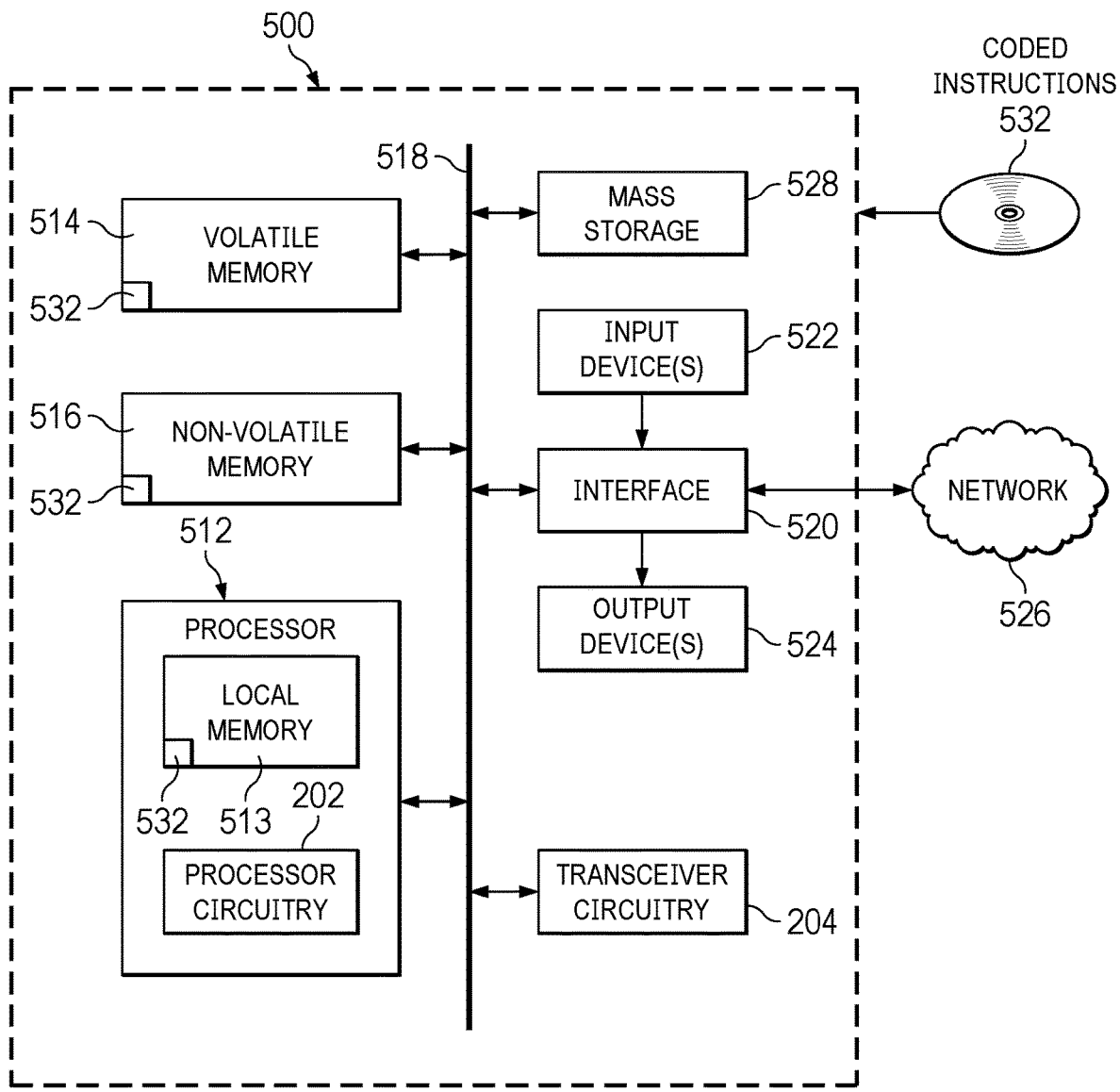
FIG. 5 is a block diagram of an example processing platform including processor circuitry structured to implement the ECU of FIG. 2.

FIG. 5 is a block diagram of an example processor platform 500 structured to implement any of the ECUs 102 of FIG. 1. The processor platform 500 can be, for example, a server, a personal computer, a workstation, a self-learning machine (e.g., a neural network), an Internet appliance, a DVD player, a CD player, or any other type of computing device.

The processor platform 500 of the illustrated example includes processor circuitry 512. The processor circuitry 512 of the illustrated example is hardware. For example, the processor circuitry 512 can be implemented by one or more integrated circuits, logic circuits, FPGAs, microprocessors, CPUs, GPUs, DSPs, and/or microcontrollers from any desired family or manufacturer. The processor circuitry 512 may be implemented by one or more semiconductor based (e.g., silicon based) devices.

The processor circuitry 512 of the illustrated example includes a local memory 513 (e.g., a cache, registers, etc.). The processor circuitry 512 of the illustrated example is in communication with a main memory including a volatile memory 514 and a non-volatile memory 516 by a bus 518. The volatile memory 514 may be implemented by Synchronous Dynamic Random Access Memory (SDRAM), Dynamic Random Access Memory (DRAM), RAMBUS® Dynamic Random Access Memory (RDRAM®), and/or any other type of RAM device. The non-volatile memory 516 may be implemented by flash memory and/or any other desired type of memory device. Access to the main memory 514 and/or 516 of the illustrated example is controlled by a memory controller.

The processor platform 500 of the illustrated example also includes interface circuitry 520. The interface circuitry 520 may be implemented by hardware in accordance with any type of interface standard, such as an Ethernet interface, a universal serial bus (USB) interface, a Bluetooth® interface, a near field communication (NFC) interface, a Peripheral Component Interconnect (PCI) interface, and/or a Peripheral Component Interconnect Express (PCIe) interface.

In the illustrated example, one or more input devices 522 are connected to the interface circuitry 520. The input device(s) 522 permit(s) a user to enter data and/or commands into the processor circuitry 512. The input device(s) 522 can be implemented by, for example, an audio sensor, a temperature sensor, a microphone, a camera (still or video), a sensor system to capture other vehicle information, a keyboard, a button, a mouse, a touchscreen, a track-pad, a trackball, and/or a voice recognition system.

One or more output devices 524 are also connected to the interface circuitry 520 of the illustrated example. The output device(s) 524 can be implemented, for example, by display devices (e.g., a light emitting diode (LED), an organic light emitting diode (OLED), a liquid crystal display (LCD), a cathode ray tube (CRT) display, an in-place switching (IPS) display, a touchscreen, etc.), a vehicle system, and/or a speaker. The interface circuitry 520 of the illustrated example, thus, typically includes a graphics driver card, a graphics driver chip, and/or graphics processor circuitry such as a GPU.

The interface circuitry 520 of the illustrated example also includes a communication device such as a transmitter, a receiver, a transceiver, a modem, a residential gateway, a wireless access point, and/or a network interface to facilitate exchange of data with external machines (e.g., computing devices of any kind) by a network 526. The communication can be by, for example, an Ethernet connection, a digital subscriber line (DSL) connection, a telephone line connection, a coaxial cable system, a satellite system, a line-of-site wireless system, a cellular telephone system, an optical connection, etc.

The processor platform 500 of the illustrated example also includes one or more mass storage devices 528 to store software and/or data. Examples of such mass storage devices 528 include magnetic storage devices, optical storage devices, floppy disk drives, HDDs, CDs, Blu-ray disk drives, redundant array of independent disks (RAID) systems, solid state storage devices such as flash memory devices and/or SSDs, and DVD drives.

The machine executable instructions 532 may be stored in the mass storage device 528, in the volatile memory 514, in the non-volatile memory 516, and/or on a removable non-transitory computer readable storage medium such as a CD or DVD.

Figure 6:
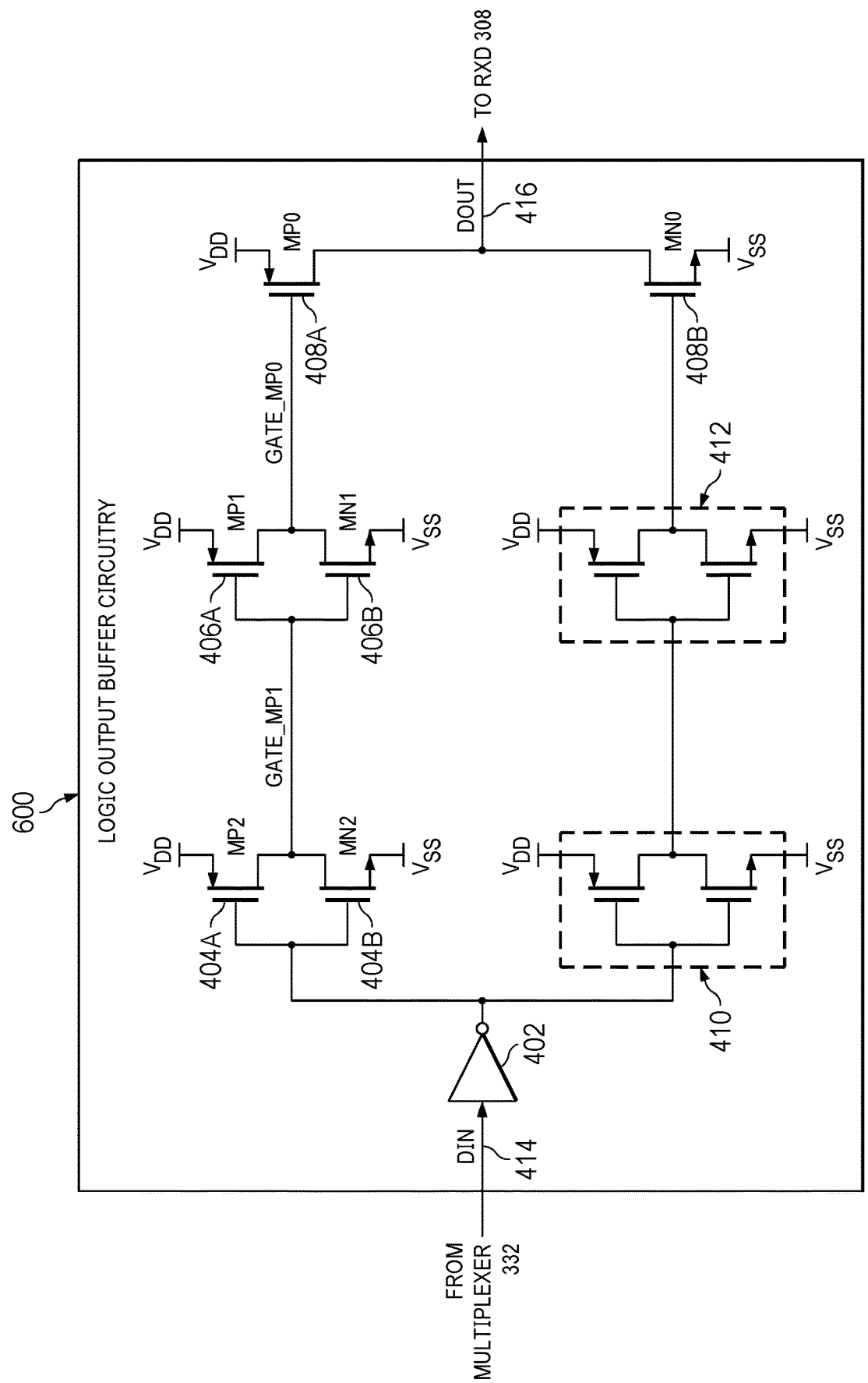
FIG. 6 is a circuit diagram of a previous implementation of a logic output buffer.

FIG. 6 is a circuit diagram of a previous implementation of a logic output buffer. The logic output buffer circuitry 600 of FIG. 6 includes the first CMOS inverter circuitry 402, second CMOS inverter circuitry 404 (which includes MP2 404A and MN2 404B), third CMOS inverter circuitry 406 (which includes MP1 406A and MN1 406B), fourth CMOS circuitry 408 (which includes MP0 408A and MN0 408B), fifth CMOS inverter circuitry 410, sixth CMOS inverter circuitry 412, the DIN voltage 414, and the DOUT voltage 416.

The logic output buffer circuitry 600 of FIG. 6 uses two branches of CMOS inverters to implement the "break before make" architecture described in FIG. 4. However, the logic output buffer circuitry 600 of FIG. 6 lacks the additional circuitry in the example logic output buffer circuitry 334 FIG. 4 to conditionally slow bit transitions when the high supply voltage is at or near +5.5 V. As a result, the previous implementation logic output buffer circuitry 600 is unable to meet the propagation delay for CAN-SIC devices when the high supply voltage is at or near +1.7 V while also mitigating electromagnetic emissions to the CAN bus 104 when the high supply voltage is at or near +5.5 V.

From the foregoing, it will be appreciated that example systems, methods, apparatus, and articles of manufacture have been disclosed that meet the propagation delay requirement for CAN-SIC transceivers and mitigate CAN bus emission regardless of the high supply voltage value. Disclosed systems, methods, apparatus, and articles of manufacture improve the efficiency of using a computing device by conditionally slowing the bit transition of logic output buffer circuitry when the high supply voltage is at or near +5.5 V. Disclosed systems, methods, apparatus, and articles of manufacture are accordingly directed to one or more improvement(s) in the operation of a machine such as a computer or other electronic and/or mechanical device.

Unless specifically stated otherwise, descriptors such as "first," "second," "third," etc., are used herein without imputing or otherwise indicating any meaning of priority, physical order, arrangement in a list, and/or ordering in any way, but are merely used as labels and/or arbitrary names to distinguish elements for ease of understanding the disclosed examples. In some examples, the descriptor "first" may be used to refer to an element in the detailed description, while the same element may be referred to in a claim with a different descriptor such as "second" or "third." In such instances, it should be understood that such descriptors are used merely for identifying those elements distinctly that might, for example, otherwise share a same name.

As used herein "substantially real time" refers to occurrence in a near instantaneous manner recognizing there may be real world delays for computing time, transmission, etc. Thus, unless otherwise specified, "substantially real time" refers to real time+/−1 second.

As used herein, the phrase "in communication," including variations thereof, encompasses direct communication and/or indirect communication through one or more intermediary components, and does not require direct physical (e.g., wired) communication and/or constant communication, but rather additionally includes selective communication at periodic intervals, scheduled intervals, aperiodic intervals, and/or one-time events.

As used herein, "processor circuitry" is defined to include (i) one or more special purpose electrical circuits structured to perform specific operation(s) and including one or more semiconductor-based logic devices (e.g., electrical hardware implemented by one or more transistors), and/or (ii) one or more general purpose semiconductor-based electrical circuits programmed with instructions to perform specific operations and including one or more semiconductor-based logic devices (e.g., electrical hardware implemented by one or more transistors). Examples of processor circuitry include programmed microprocessors, Field Programmable Gate Arrays (FPGAs) that may instantiate instructions, Central Processor Units (CPUs), Graphics Processor Units (GPUs), Digital Signal Processors (DSPs), XPUs, or microcontrollers and integrated circuits such as Application Specific Integrated Circuits (ASICs). For example, an XPU may be implemented by a heterogeneous computing system including multiple types of processor circuitry (e.g., one or more FPGAs, one or more CPUs, one or more GPUs, one or more DSPs, etc., and/or a combination thereof) and application programming interface(s) (API(s)) that may assign computing task(s) to whichever one(s) of the multiple types of the processing circuitry is/are best suited to execute the computing task(s).

The term "couple" is used throughout the specification. The term may cover connections, communications, or signal paths that enable a functional relationship consistent with this description. For example, if device A provides a signal to control device B to perform an action, in a first example device A is coupled to device B, or in a second example device A is coupled to device B through intervening component C if intervening component C does not substantially alter the functional relationship between device A and device B such that device B is controlled by device A via the control signal provided by device A.

In this description, the term "and/or" (when used in a form such as A, B and/or C) refers to any combination or subset of A, B, C, such as: (a) A alone; (b) B alone; (c) C alone; (d) A with B; (e) A with C; (f) B with C; and (g) A with B and with C. Also, as used herein, the phrase "at least one of A or B" (or "at least one of A and B") refers to implementations including any of: (a) at least one A; (b) at least one B; and (c) at least one A and at least one B.

A device that is "configured to" perform a task or function may be configured (e.g., programmed and/or hardwired) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof.

As used herein, the terms "terminal", "node", "interconnection", "pin" and "lead" are used interchangeably. Unless specifically stated to the contrary, these terms are generally used to mean an interconnection between or a terminus of a device element, a circuit element, an integrated circuit, a device or other electronics or semiconductor component.

While the use of particular transistors are described herein, other transistors (or equivalent devices) may be used instead with little or no change to the remaining circuitry. For example, a metal-oxide-silicon FET ("MOSFET") (such as an re-channel MOSFET, nMOSFET, or a p-channel MOSFET, pMOSFET), a bipolar junction transistor (BJT—e.g. NPN or PNP), insulated gate bipolar transistors (IGBTs), and/or junction field effect transistor (JFET) may be used in place of or in conjunction with the devices disclosed herein. The transistors may be depletion mode devices, drain-extended devices, enhancement mode devices, natural transistors or other type of device structure transistors. Furthermore, the devices may be implemented in/over a silicon substrate (Si), a silicon carbide substrate (SiC), a gallium nitride substrate (GaN) or a gallium arsenide substrate (GaAs).

While certain elements of the described examples are included in an integrated circuit and other elements are external to the integrated circuit, in other example embodiments, additional or fewer features may be incorporated into the integrated circuit. In addition, some or all of the features illustrated as being external to the integrated circuit may be included in the integrated circuit and/or some features illustrated as being internal to the integrated circuit may be incorporated outside of the integrated. As used herein, the term "integrated circuit" means one or more circuits that are: (i) incorporated in/over a semiconductor substrate; (ii) incorporated in a single semiconductor package; (iii) incorporated into the same module; and/or (iv) incorporated in/on the same printed circuit board.

Uses of the phrase "ground" in the foregoing description include a chassis ground, an Earth ground, a floating ground, a virtual ground, a digital ground, a common ground, and/or any other form of ground connection applicable to, or suitable for, the teachings of this description. Unless otherwise stated, "about," "approximately," or "substantially" preceding a value means+/−10 percent of the stated value, or, if the value is zero, a reasonable range of values around zero. Modifications are possible in the described examples, and other examples are possible within the scope of the claims.

The following claims are hereby incorporated into this Detailed Description by this reference. Although certain example systems, methods, apparatus, and articles of manufacture have been disclosed herein, the scope of coverage of this patent is not limited thereto. On the contrary, this patent covers all systems, methods, apparatus, and articles of manufacture fairly falling within the scope of the claims of this patent.

What is claimed is:

1. An apparatus to buffer a data signal comprising:
   a first current controlled transistor;
   a second current controlled transistor;
   a first inverter having an input and having an output;
   a second inverter having an input coupled to the output of the first inverter and having an output, the second inverter coupled to the first current controlled transistor;
   a third inverter having an input coupled to the output of the second inverter and having an output, the third inverter coupled to the second current controlled transistor;
   an output transistor having a control terminal coupled to the output of the third inverter, a first current terminal coupled to a supply voltage and having a second current terminal coupled to an output;
   a first switch to control the first current controlled transistor;
   a second switch to control the second current controlled transistor;
   a supply divider;
   a resistive capacitance (RC) filter; and
   a Schmitt trigger, wherein the RC filter and the Schmitt trigger control both the first switch and the second switch.

2. The apparatus of claim 1, wherein a rate at which a voltage at the output of the second inverter changes is based on a first amount of current provided to the second inverter, wherein, in response to a determination that a first divider voltage meets a first threshold voltage corresponding to the first current controlled transistor:
   the RC filter and the Schmitt trigger cause the first switch to enable the first current controlled transistor;
   a first portion of the first amount of current is provided to the first current controlled transistor; and
   a second portion of the first amount of current is provided to the second inverter.

3. The apparatus of claim 2, wherein a rate at which a voltage at the output of the third inverter changes is based on a second amount of current provided to the third inverter, wherein, in response to a determination that a difference between a high supply voltage and a second divider voltage meets a second threshold voltage corresponding to the second current controlled transistor:
   the RC filter and the Schmitt trigger cause the second switch to enable the second current controlled transistor;
   a first portion of the second amount of current is provided to the second current controlled transistor; and
   a second portion of the second amount of current is provided to the third inverter.

4. The apparatus of claim 3, wherein, in response to a determination that the voltage at the output of the third inverter meets a trigger threshold voltage, the RC filter and the Schmitt trigger:
   cause the first switch to disable the first current controlled transistor; and
   cause the second switch to disable the second current controlled transistor.

5. The apparatus of claim 1, wherein one or more of the first inverter, second inverter, third inverter, and fourth inverter are Complementary Metal Oxide Semiconductor (CMOS) inverter circuits.

6. An electronic control unit (ECU) comprising:
   a transceiver having an input and an output, the transceiver includes:
   a first current controlled transistor;
   a second current controlled transistor;
   a first inverter having an input and having an output;
   a second inverter having an input coupled to the output of the first inverter and having an output, the second inverter coupled to the first current controlled transistor;
   a third inverter having an input coupled to the output of the second inverter and having an output, the third inverter coupled to the second current controlled transistor;
   an output transistor having a control terminal coupled to the output of the third inverter, a first current terminal coupled to a supply voltage and having a second current terminal coupled to an output; and
   a processor coupled to the input and output of the transceiver.

7. The ECU of claim 6, wherein the ECU is a first ECU and a Controller Area Network (CAN) bus is coupled between the first ECU and a second ECU.

8. The ECU of claim 6, further including:
   a first switch to control the first current controlled transistor;
   a second switch to control the second current controlled transistor;
   a supply divider;
   a resistive capacitance (RC) filter; and
   a Schmitt trigger, wherein the RC filter and the Schmitt trigger control both the first switch and the second switch.

9. The ECU of claim 8, wherein a rate at which a voltage at the output of the second inverter changes is based on a first amount of current provided to the second inverter, wherein, in response to a determination that a first divider voltage meets a first threshold voltage corresponding to the first current controlled transistor:
   the RC filter and the Schmitt trigger cause the first switch to enable the first current controlled transistor;

a first portion of the first amount of current is provided to the first current controlled transistor; and a second portion of the first amount of current is provided to the second inverter.

10. The ECU of claim 9, wherein a rate at which a voltage at the output of the third inverter changes is based on a second amount of current provided to the third inverter, wherein, in response to a determination that a difference between a high supply voltage and a second divider voltage meets a second threshold voltage corresponding to the second current controlled transistor:

the RC filter and the Schmitt trigger cause the second switch to enable the second current controlled transistor;

a first portion of the second amount of current is provided to the second current controlled transistor; and a second portion of the second amount of current is provided to the third inverter.

11. The ECU of claim 10, wherein, in response to a determination that the voltage at the output of the third inverter meets a trigger threshold voltage, the RC filter and the Schmitt trigger:

cause the first switch to disable the first current controlled transistor; and cause the second switch to disable the second current controlled transistor.

12. The ECU of claim 6, wherein one or more of the first inverter, second inverter, third inverter, and fourth inverter are Complementary Metal Oxide Semiconductor (CMOS) inverter circuits.

13. A system adapted to be implemented into a vehicle, the system comprising:

first electronic control unit (ECU) operable to provide data;

a second ECU having an input and an output, the second ECU includes:

a first current controlled transistor;

a second current controlled transistor;

a first inverter having an input and having an output;

a second inverter having an input coupled to the output of the first inverter and having an output, the second inverter coupled to the first current controlled transistor;

a third inverter having an input coupled to the output of the second inverter and having an output, the third inverter coupled to the second current controlled transistor;

an output transistor having a control terminal coupled to the output of the third inverter, a first current terminal coupled to a supply voltage and having a second current terminal coupled to an output; and a Controller Area Network (CAN) bus coupled between the first ECU and the input and output of the second ECU.

14. The system of claim 13, wherein the second ECU further includes:

a first switch to control the first current controlled transistor;

a second switch to control the second current controlled transistor;

a supply divider;

a resistive capacitance (RC) filter; and a Schmitt trigger, wherein the RC filter and the Schmitt trigger control both the first switch and the second switch.

15. The system of claim 14, wherein a rate at which a voltage at the output of the second inverter changes is based on a first amount of current provided to the second inverter, wherein, in response to a determination that a first divider voltage meets a first threshold voltage corresponding to the first current controlled transistor:

the RC filter and the Schmitt trigger cause the first switch to enable the first current controlled transistor;

a first portion of the first amount of current is provided to the first current controlled transistor; and a second portion of the first amount of current is provided to the second inverter.

16. The system of claim 15, wherein a rate at which a voltage at the output of the third inverter changes is based on a second amount of current provided to the third inverter, wherein, in response to a determination that a difference between a high supply voltage and a second divider voltage meets a second threshold voltage corresponding to the second current controlled transistor:

the RC filter and the Schmitt trigger cause the second switch to enable the second current controlled transistor;

a first portion of the second amount of current is provided to the second current controlled transistor; and a second portion of the second amount of current is provided to the third inverter.

17. The system of claim 16, wherein, in response to a determination that the voltage at the output of the third inverter meets a trigger threshold voltage, the RC filter and the Schmitt trigger:

cause the first switch to disable the first current controlled transistor; and cause the second switch to disable the second current controlled transistor.

18. The system of claim 13, wherein one or more of the first inverter, second inverter, third inverter, and fourth inverter are Complementary Metal Oxide Semiconductor (CMOS) inverter circuits.

* * * * *